(12) United States Patent
Watanabe et al.

(10) Patent No.: US 12,241,926 B2
(45) Date of Patent: *Mar. 4, 2025

(54) TEST APPARATUS

(71) Applicants: ADVANTEST CORPORATION, Tokyo (JP); TOEI SCIENTIFIC INDUSTRIAL CO., LTD., Sendai (JP)

(72) Inventors: Naoyoshi Watanabe, Tokyo (JP); Shigeyuki Sato, Sendai (JP); Ryoichi Utsumi, Sendai (JP)

(73) Assignees: ADVANTEST CORPORATION, Tokyo (JP); TOEI SCIENTIFIC INDUSTRIAL CO., LTD., Sendai (JP)

( * ) Notice: Subject to any disclaimer, the term of this patent is extended or adjusted under 35 U.S.C. 154(b) by 207 days.

This patent is subject to a terminal disclaimer.

(21) Appl. No.: 17/512,021

(22) Filed: Oct. 27, 2021

(65) Prior Publication Data

US 2022/0050136 A1  Feb. 17, 2022

Related U.S. Application Data

(63) Continuation of application No. PCT/JP2020/046821, filed on Dec. 15, 2020.

(30) Foreign Application Priority Data

Feb. 10, 2020 (JP) .................... 2020-020831

(51) Int. Cl.
*G01R 31/26* (2020.01)
*G01R 1/04* (2006.01)
(Continued)

(52) U.S. Cl.
CPC ....... *G01R 31/2601* (2013.01); *G01R 1/0491* (2013.01); *G01R 1/07342* (2013.01); *G01R 31/2831* (2013.01)

(58) Field of Classification Search
CPC ............ G01R 31/2889; G01R 31/26; G01R 31/2601; G01R 1/07342; G01R 1/067;
(Continued)

(56) References Cited

U.S. PATENT DOCUMENTS

2013/0009659 A1* 1/2013 Liu .................... G01R 1/07307
324/756.02
2019/0137543 A1* 5/2019 Eo ........................ G01R 1/0491
(Continued)

FOREIGN PATENT DOCUMENTS

CN  1249535 A  4/2000
CN  107305236 A  10/2017
(Continued)

OTHER PUBLICATIONS

International Search Report for International Application No. PCT/JP2020/046821; Date of Mailing; Feb. 22, 2021.
(Continued)

*Primary Examiner* — David M Schindler
(74) *Attorney, Agent, or Firm* — CANTOR COLBURN LLP

(57) ABSTRACT

A test apparatus tests a wafer under test on which devices under test each including magnetoresistive memory or a magnetic sensor are formed. In a test process, the wafer under test is mounted on a stage. In the test process, a magnetic field application apparatus applies a magnetic field $B_{EX}$ to the wafer under test. A test probe card is used in the test process. Multiple magnetization detection units are formed on a diagnostic wafer. In a diagnostic process of the test apparatus, the diagnostic wafer is mounted on the stage instead of the wafer under test. Each magnetization detection unit is capable of measuring a magnetic field $B_{EX}$ generated
(Continued)

by the magnetic field application apparatus. In the diagnostic process, the diagnostic probe card is used instead of the test probe card.

6 Claims, 12 Drawing Sheets

(51) Int. Cl.
  G01R 1/073 (2006.01)
  G01R 31/28 (2006.01)
(58) Field of Classification Search
  CPC .......... G01R 1/07307; G01R 33/1207; G01R 31/2886; G01R 31/2831; G01R 31/318511; G01R 31/318505; G01R 31/265; G01R 1/0491; G01R 33/0029; G01R 33/072; G01R 33/091; G01R 33/0035; G01R 33/02; G01R 33/07; G01R 33/0023; H10N 50/01; H01L 22/00
  See application file for complete search history.

(56) References Cited

U.S. PATENT DOCUMENTS

| | | | |
|---|---|---|---|
| 2019/0178933 A1* | 6/2019 | Lindenberg | G01R 31/2865 |
| 2021/0172978 A1* | 6/2021 | Funatoko | G01R 1/07392 |

FOREIGN PATENT DOCUMENTS

| | | |
|---|---|---|
| EP | 3070486 A1 | 9/2016 |
| JP | H04334077 A | 11/1992 |
| JP | 2004151056 A | 5/2004 |
| JP | 2007024518 A | 2/2007 |
| JP | 2007147568 A | 6/2007 |
| JP | 2007243068 A | 9/2007 |
| JP | 2008139305 A | 6/2008 |
| JP | 2009069005 A | 4/2009 |
| JP | 2012198102 A | 10/2012 |
| TW | 200613740 A | 5/2006 |
| TW | 201538986 A | 10/2015 |

OTHER PUBLICATIONS

TIPO Notification of Reasons for Rejection for corresponding TW Application No. 110100137; Issued on Jul. 26, 2021.
International Preliminary Report on Patentability with Written Opinion of the International Searching Authority for the Internatonal Patent Application No. PCT/JP2020/046821; Mailing Date Aug. 11, 2022.
CNIPA First Office Action for corresponding CN Application No. 202080031184.1; Issued Dec. 29, 2023; 15 pages.
CNIPA Second Office Action for corresponding CN Application No. 202080031184.1; Issued Jun. 30, 2024.

* cited by examiner

TEST APPARATUS

CROSS REFERENCE TO RELATED APPLICATIONS

This application is a continuation under 35 U.S.C. § 120 of PCT/JP2020/046821, filed Dec. 15, 2020, which is incorporated herein reference and which claimed priority to Japanese Application No. 2020-020831, filed Feb. 10, 2020. The present application likewise claims priority under 35 U.S.C. § 119 to Japanese Application No. 2020-020831, filed Feb. 10, 2020, the entire content of which is also incorporated herein by reference.

BACKGROUND

1. Technical Field

The present disclosure relates to a semiconductor test apparatus.

2. Description of the Related Art

As next-generation memory, Magnetoresistive Random Access Memory (MRAM) is being developed. Magnetoresistive random access memory records information using the magnetization state of a Magnetic Tunnel Junction (MTJ). This allows the magnetoresistive random memory to function as nonvolatile memory, unlike other kinds of memory that use the charge state, such as Static RAM (SRAM), Dynamic RAM (DRAM), or the like.

In order to write data to MRAM, there is a need to apply a magnetic field to an MTJ so as to change the magnetization state of the MTJ. In other words, if the magnetization state of the MTJ is changed due to an external magnetic field, this leads to data corruption. In order to solve such a problem, from now on, specifications will be defined that include the magnetic characteristics when an external magnetic field is applied or the like in addition to the electrical characteristics, and there is a need for MRAM to be tested with respect to the magnetic characteristics before assembly processing.

MRAM devices are tested in a wafer state before being diced into chips, as with DRAM or the like. A test apparatus simultaneously tests multiple chips in a state in which an external magnetic field is applied over a wide area of the wafer. In this test, the test apparatus is required to ensure that an external magnetic field that satisfies the specifications is applied to multiple chips distributed over a wide area.

With conventional techniques, there has been a need to prepare a commercially available magnetic sensor in addition to the test apparatus. The magnetic sensor thus prepared is required to be arranged in the vicinity of an area where an external magnetic field is to be applied, so as to measure the external magnetic field. In this technique, it is difficult to provide perfect matching between the position of the magnetic sensor and the position of an actual wafer in the height direction. The magnetic field strength is inversely proportional to the square of the distance. Accordingly, even a slight position difference leads to a large measurement error. Accordingly, the magnetic field measured by a conventional commercially available magnetic sensor exhibits a value that differs from that of an actual magnetic field to be applied to MRAM devices on a wafer.

In addition, in a case of employing such commercially available magnetic sensors, from the viewpoint of the size and cost thereof, the number of the magnetic sensors that can be employed is limited. Accordingly, although this allows a magnetic field to be measured at several points, it is difficult to measure the spatial distribution of the magnetic field.

Here, for exemplary purposes, description is made regarding MRAM devices. However, the same problem occurs in a test apparatus configured to test a chip on which magnetic sensors are integrated.

SUMMARY

The present disclosure has been made in order to solve such a problem.

An embodiment of the present disclosure relates to a test apparatus structured to test a wafer under test on which devices under test each including magnetoresistive memory or a magnetic sensor are formed. The test apparatus includes: a test head; a stage on which the wafer under test is to be mounted in a test process; a magnetic field application apparatus structured to apply a magnetic field to the wafer under test in the test process; a test probe card to be used in the test process, and structured such that it can make probe contact with the wafer under test; a diagnostic wafer on which multiple magnetization detection units are formed, and structured to measure a magnetic field generated by the magnetic field application apparatus by means of each magnetization detection unit in a state in which the diagnostic wafer is mounted on the stage instead of the wafer under test in a diagnostic process of the test apparatus; and a diagnostic probe card to be used in the diagnostic process instead of the test probe card, and structured such that it can make probe contact with the diagnostic wafer.

It is to be noted that any arbitrary combination or rearrangement of the above-described structural components and so forth is effective as and encompassed by the present embodiments. Moreover, all of the features described in this summary are not necessarily required by embodiments so that the embodiment may also be a sub-combination of these described features. In addition, embodiments may have other features not described above.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Figure 1:
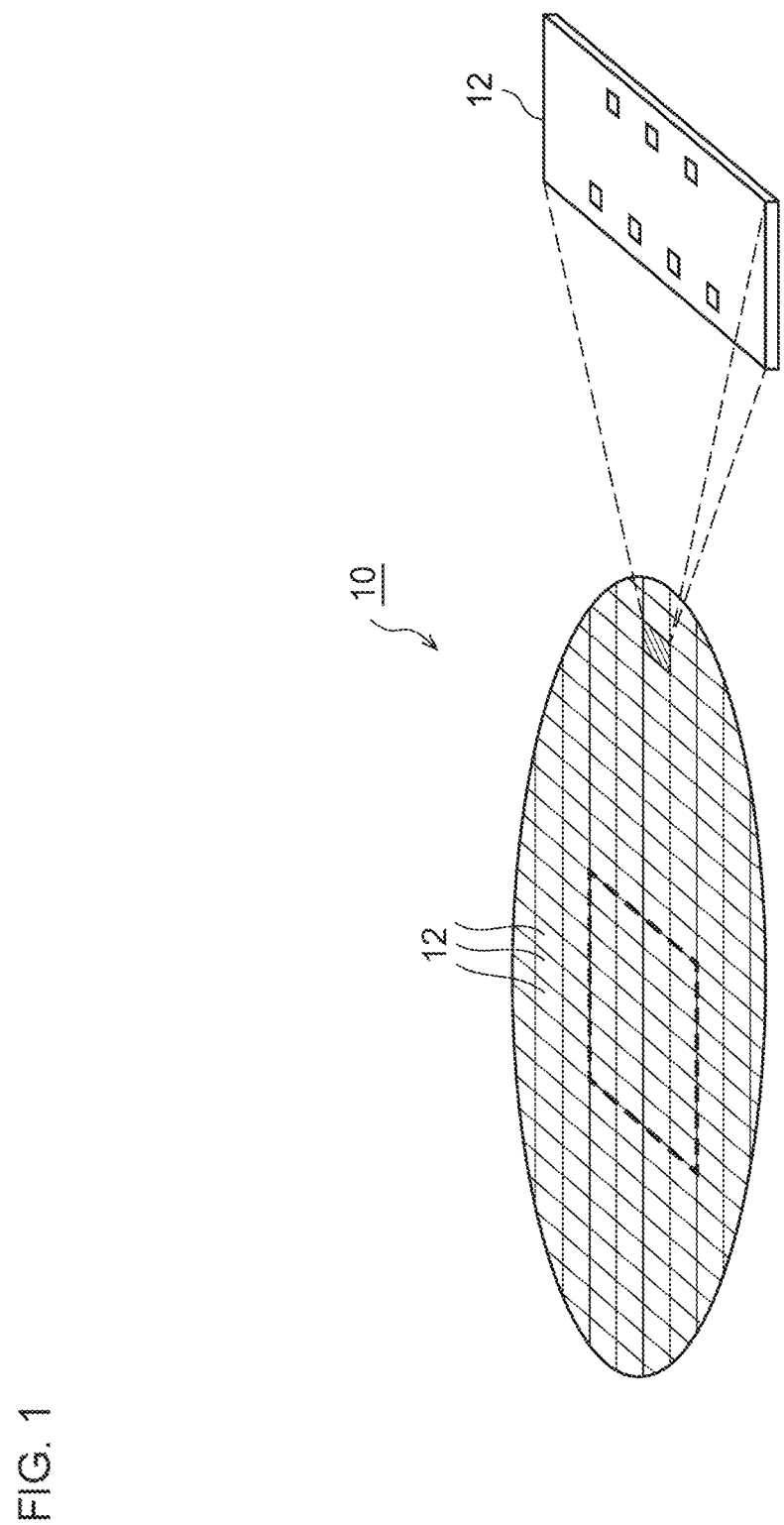
FIG. 1 is a diagram showing a wafer under test.

An outline of several example embodiments of the disclosure follows. This outline is provided for the convenience of the reader to provide a basic understanding of such embodiments and does not wholly define the breadth of the disclosure. This outline is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

A test apparatus according to one embodiment relates to a test apparatus structured to test a wafer under test on which devices under test each including magnetoresistive memory or a magnetic sensor are formed. The test apparatus includes: a test head; a stage on which the wafer under test is to be mounted in a test process; a magnetic field application apparatus structured to apply a magnetic field to the wafer under test in the test process; a test probe card to be used in the test process, and structured such that it can make probe contact with the wafer under test; a diagnostic wafer on which multiple magnetization detection units are formed, and structured to measure a magnetic field generated by the magnetic field application apparatus by means of each magnetization detection unit in a state in which the diagnostic wafer is mounted on the stage instead of the wafer under test in a diagnostic process of the test apparatus; and a diagnostic probe card to be used in the diagnostic process instead of the test probe card, and structured such that it can make probe contact with the diagnostic wafer.

In one embodiment, the magnetization detection units formed on the diagnostic wafer are positioned at the same height as that of the devices under test formed on the wafer under test. Accordingly, such an arrangement provides high-precision measurement of an external magnetic field to be applied to the devices under test formed on the wafer under test by means of the magnetization detection units formed on the diagnostic wafer. The output of each magnetization detection unit is input to the test head via the diagnostic probe card. Subsequently, the outputs of the magnetization detection units can be effectively processed by the test head or the hardware components of the tester main body.

In one embodiment, the test apparatus may further include a connection unit arranged between the test probe card or the diagnostic probe card and the test head. Also, the magnetic field application apparatus may be provided to the connection unit. The electromagnet generates a magnetic field with an intensity that changes according to the current supplied. Accordingly, the electromagnet itself acts as a heat source. With this arrangement, the magnetic field application apparatus which acts as a heat source can be separated by means of the wafer from the stage to be temperature controlled. In a case in which the magnetic field application apparatus is arranged below or to the side of the stage, such an arrangement requires additional wiring or an interface for transmitting a control signal to the magnetic field application apparatus. In contrast, with the present embodiment, this allows a control signal to be transmitted to the magnetic field application apparatus using the existing interface between the test head and the connection unit, thereby allowing the system to be designed in a simple manner.

In one embodiment, the magnetic field application apparatus may be arranged below the stage or may be arranged to the side of the stage.

In one embodiment, the multiple magnetization detection units may each include: a magnetic sensor; and an amplifier structured to amplify an electrical signal output from the magnetic sensor. The magnetic sensor is an element configured such that its electrical state changes according to the magnetic field. Examples of the magnetic sensor include magnetoresistive (MR) elements, magneto-impedance (MI) elements, Hall elements, etc. However, the present invention is not restricted to such an example. With such an arrangement in which the amplifiers are integrated on the diagnostic wafer, and the amplified signals are read out by the probe card, this provides improved noise resistance.

In one embodiment, the multiple magnetization detection units may each include a magnetic sensor. Also, the diagnostic probe card may include multiple amplifiers that correspond to the multiple magnetization detection units. Also, each amplifier may be structured to amplify an electrical signal output from the corresponding magnetic sensor. In this case, this allows a discrete component to be employed as an amplifier. This allows an amplifier with more stable and/or higher performance to be employed as compared with the amplifier integrated formed on the diagnostic wafer.

Description will be made below regarding preferred embodiments with reference to the drawings. In each drawing, the same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

Embodiment 1

FIG. 1 is a diagram showing a wafer under test 10. Multiple devices under test 12 are formed on the wafer under test 10. After dicing, the multiple chips of the devices under test 12 are obtained. In the present embodiment, the device under test 12 is configured as MRAM. The device under test 12 includes an MTJ that forms a cell of the MRAM, a peripheral circuit thereof, and multiple contact pins (electrodes). The broken line 14 indicates the measurement area (which will be referred to as a "simultaneous measurement area") to be simultaneously measured by a test apparatus 100 described later. Typically, the test apparatus 100 simultaneously measures multiple (e.g., 256 or 128) devices under test 12.

Figure 2:
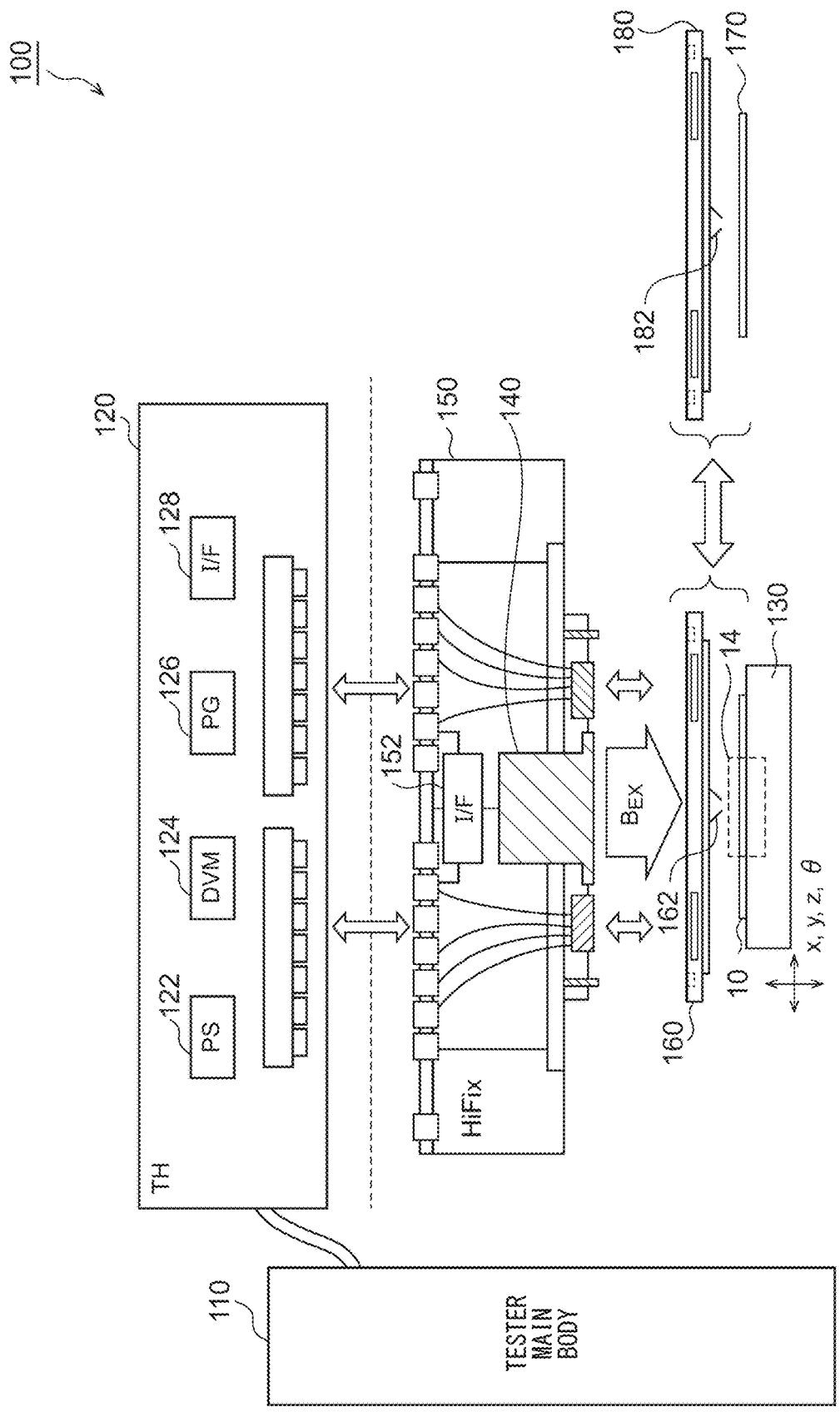
FIG. 2 is a block diagram showing a test apparatus according to an embodiment 1.

FIG. 2 is a block diagram showing a test apparatus according to an embodiment 1. The test apparatus 100 is a wafer test apparatus configured to test the wafer under test 10 shown in FIG. 1. The test apparatus 100 includes a tester main body 110, a test head 120, a stage 130, a magnetic field application apparatus 140, a wafer connection HiFix 150, a test probe card 160, a diagnostic wafer 170, and a diagnostic probe card 180.

The tester main body 110 is provided with a processing device that executes a test program, and integrally controls the test apparatus 100.

The test head 120 includes built-in hardware components such as a device power supply 122 that supplies electric power to the device under test 12, a voltage/current measurement device (DVM) 124, a pattern generator 126, an interface circuit 128, etc. The hardware components are controlled by the tester main body 110. A part of the hardware components may be provided to the tester main body 110. The interface circuit (transceiver) 128 is configured to allow data to be transmitted to and received from an interface circuit 152 provided to the wafer connection HiFix 150. The kind of the interface circuit 128 is not restricted in particular. For example, various kinds of protocols such as Ethernet (trademark), Universal Serial Bus (USB), and so on may be employed.

The stage 130 is also referred to as a "chuck". In the test process, the wafer under test 10 is mounted on the stage 130. The stage 130 is configured such that it can be moved in the X, Y, and Z directions. Furthermore, the stage 130 may be configured such that it can be rotated in the θ direction around the Z axis.

In the test process, the magnetic field application apparatus 140 applies an external magnetic field $B_{EX}$ to the wafer under test 10. Specifically, the magnetic field application apparatus 140 is configured to apply a substantially uniform external magnetic field $B_{EX}$ to a simultaneous measurement area 14 of the wafer under test 10, i.e., to the multiple devices under test 12 included in the simultaneous measurement area 14. The configuration of the magnetic field application apparatus 140 is not restricted in particular. The magnetic field application apparatus 140 may be configured as an electromagnet that allows the magnitude or the waveform of the external magnetic field $B_{EX}$ to be electrically controlled.

As the MRAM, a type in which a vertical magnetic field is applied and a type in which a horizontal magnetic field is applied are known. The direction of the external magnetic field $B_{EX}$ to be generated by the magnetic field application apparatus 140 is determined according to the kind of the MRAM. Description will be made regarding an example in which the external magnetic field $B_{EX}$ is applied in a direction that is orthogonal to the wafer under test 10.

The test probe card 160 is configured such that it can make probe contact with respect to the wafer under test 10 in the test process. Specifically, the bottom face of the test probe card 160 is provided with multiple probe needles 162 structured such that they can be in contact with multiple pins provided to the wafer under test 10.

A connection unit (interface), which will be referred to as a "wafer connection High Fidelity Tester Access Fixture (HiFix) 150", is provided between the test head 120 and the test probe card 160. A signal is transmitted between the test head 120 and the test probe card 160 via the wafer connection HiFix 150. In the present embodiment, the magnetic field application apparatus 140 is provided to the wafer connection HiFix 150. A control signal for the magnetic field application apparatus 140 can be transmitted by communication between the interface circuit 128 of the test head 120 and the interface circuit 152 of the wafer connection HiFix 150.

The above is the basic configuration of the test apparatus 100. In a normal test process, while the external magnetic field $B_{EX}$ is applied by the magnetic field application apparatus 140 to a plurality of devices under test 12 included in the simultaneous measurement area 14, data writing and data reading are executed for each MRAM that is a device under test 12, so as to test whether or not the device under test 12 operates normally. Subsequently, the same processing is repeated while moving the position of the wafer under test 10 by means of the stage 130, thereby testing all the chips on the wafer under test 10.

The test apparatus 100 is configured to be capable of measuring the external magnetic field $B_{EX}$ generated by the magnetic field application apparatus 140 in a diagnostic process. In order to diagnose and calibrate the magnetic field application apparatus 140, the test apparatus 100 is used together with the diagnostic wafer 170 and the diagnostic probe card 180.

Figure 3:
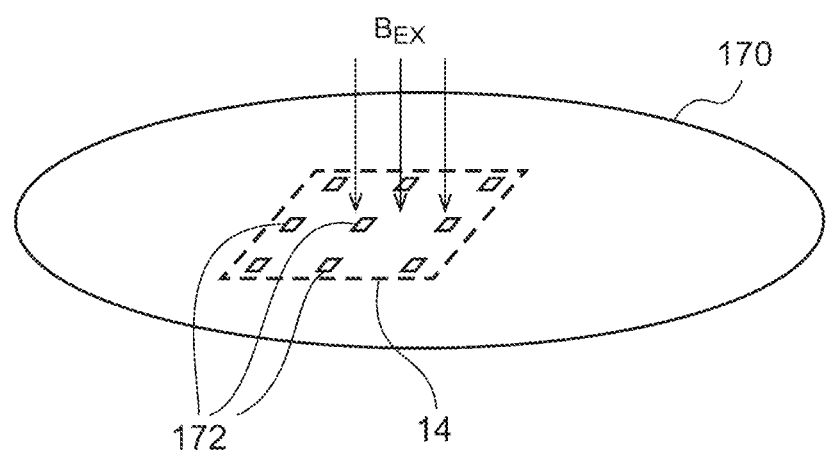
FIG. 3 is a diagram showing a diagnostic wafer.

FIG. 3 is a diagram showing the diagnostic wafer 170. In the diagnostic process of the test apparatus 100, the diagnostic wafer 170 is mounted on the stage 130 instead of the wafer under test 10. Multiple magnetization detection units 172 each configured to be capable of measuring the magnetic field $B_{EX}$ to be generated by the magnetic field application apparatus 140 are formed on the diagnostic wafer 170. In FIG. 3, the synchronous measurement area 14 is indicated by the broken line. It can be said that the synchronous measurement area 14 means an area that ensures that a uniform external magnetic field $B_{EX}$ can be applied. The material of the diagnostic wafer 170 is not restricted in particular. Various kinds of semiconductor substrates formed of silicon, SiC, GaN, or the like may be employed. Also, a substrate formed of a material that differs from a semiconductor material may be employed.

The multiple magnetization detection units 172 are arranged in the synchronous measurement area 14 that ensures that the external magnetic field $B_{EX}$ can be applied with a uniform strength distribution to the wafer under test 10 from the magnetic field application apparatus or over an area that is wider than the synchronous measurement area 14, thereby allowing the external magnetic field $B_{EX}$ intensity distribution to be detected. In this example, nine magnetization detection units 172 are shown. However, the number of the magnetization detection units 172 is not restricted in particular. In a case in which the external magnetic field $B_{EX}$ is to be detected with high spatial resolution, the number of the magnetization detection units 172 may preferably be increased. Otherwise, the number of the magnetization detection units 172 may be reduced.

Returning to FIG. 2, the diagnostic probe card 180 and the diagnostic wafer 170 are used as a set. In the diagnostic process, the diagnostic probe card 180 is mounted on the wafer connection HiFix 150 instead of the test probe card 160. The diagnostic probe card 180 is arranged such that it faces the diagnostic wafer 170. The diagnostic probe card 180 is configured so as to enable probe contact with the diagnostic wafer 170. Specifically, the bottom face of the diagnostic probe card 180 is provided with multiple probe needles 182 structured such that they can be in contact with multiple pins provided to the diagnostic wafer 170.

Figure 4:
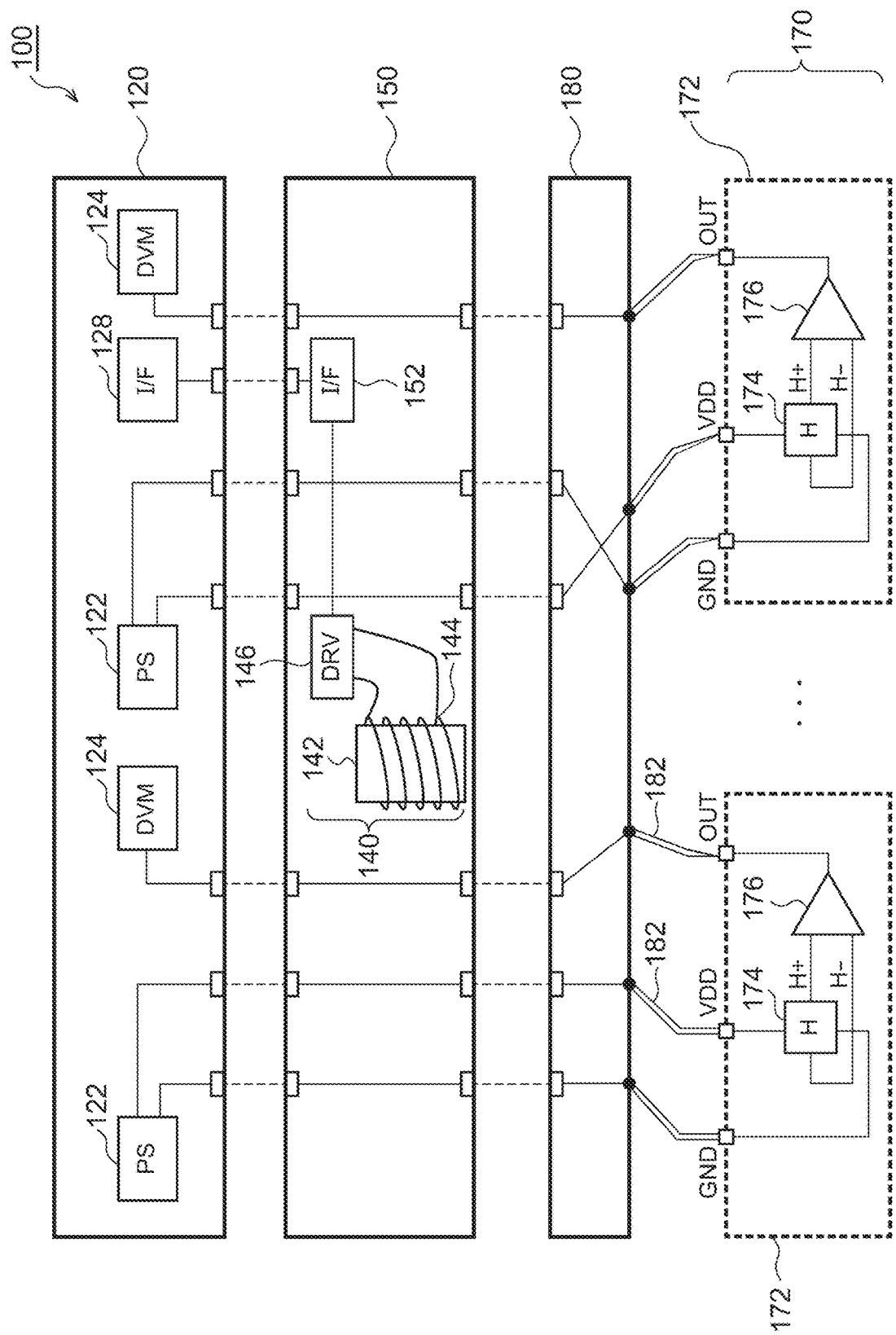
FIG. 4 is a diagram showing a configuration of the test apparatus in a diagnostic process.

FIG. 4 is a diagram showing a configuration of the test apparatus 100 in the diagnostic process. Multiple magnetization detection units 172 are formed on the diagnostic wafer 170. Each magnetization detection unit 172 has a three-terminal configuration (VDD, GND, OUT) including a magnetization sensor 174 and an amplifier 176 that amplifies the difference between electrical signals H+ and H−, which are outputs of the magnetization sensor 174. In this example, the magnetization sensor 174 is configured as a Hall element. A power supply voltage generated by the device power supply 122 is supplied to the power supply pin VDD of the magnetization detection unit 172 via the wafer connection HiFix 150 and the diagnostic probe card 180. Furthermore, the ground voltage of the device power supply 122 is supplied to the ground pin VDD of the magnetization detection unit 172 via the wafer connection HiFix 150 and the diagnostic probe card 180. Moreover, a detection signal occurs at the output pin OUT of each magnetization detection unit 172 according to the external magnetic field $B_{EX}$ received by the magnetization sensor 174. The output pin OUT is coupled to the DVM 124 via the wafer connection HiFix 150 and the diagnostic probe card 180. With this, the detection signal is acquired in the form of a digital signal.

The wafer connection HiFix 150 is provided with the magnetic field application apparatus 140. It should be noted that the magnetic field application apparatus 140 is shown with a reduced scale because of space limitations. In actuality, the magnetic field application apparatus 140 has an area that covers the multiple magnetization detection units 172. The magnetic field application apparatus 140 includes a single core 142 or multiple cores 142, coils 144 each wound on the corresponding core 142, and a driving circuit 146. The driving circuit 146 receives a control signal supplied from the test head 120, and controls a current that flows through the coil 144 according to the control signal, so as to generate the external magnetic field $B_{EX}$.

In the diagnostic process, contact may be made simultaneously to all of the plurality of N magnetization detection units 172 formed on the diagnostic wafer 170. In this state, the external magnetic field $B_{EX}$ may be measured for all the N points simultaneously by means of all N magnetization detection units 172. Alternatively, instead of such a measurement in which the external magnetic field $B_{EX}$ is measured for the N points simultaneously, the external magnetic field $B_{EX}$ may be measured in a divided manner several times.

Figure 5:
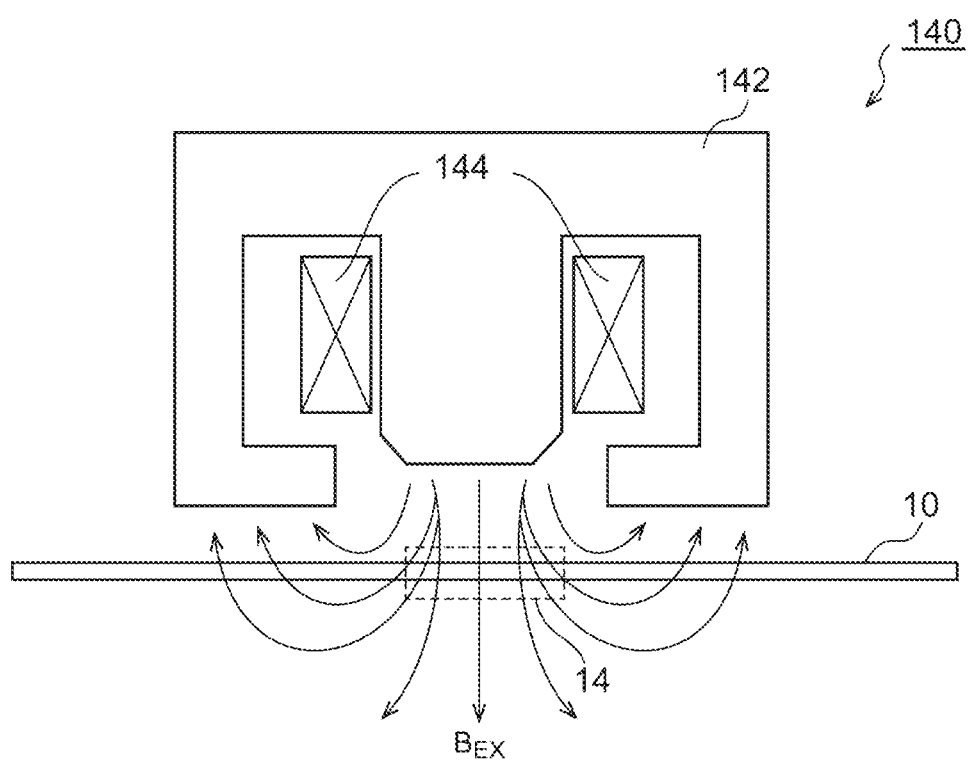
FIG. 5 is a cross-sectional diagram showing a magnetic field application apparatus.

FIG. 5 is a cross-sectional diagram showing the magnetic field application apparatus 140. The magnetic field application apparatus 140 includes a core 142 and a coil 144 wound on the core 142. With this configuration, this is capable of applying the external magnetic field $B_{EX}$ that is orthogonal to the wafer under test 10. As described above, the magnetic field application apparatus 140 is built into the wafer connection HiFix 150. The test probe card 160 is not shown in FIG. 5.

The above is the configuration of the test apparatus 100. Next, description will be made regarding the advantages of the test apparatus 100.

With this, the magnetization detection units 172 formed on the diagnostic wafer 170 are positioned at the same height at that of the devices under test 12 formed on the wafer under test 10. Accordingly, the external magnetic field $B_{EX}$ to be applied to the devices under test 12 formed on the wafer under test 10 can be measured with high precision by means of the magnetization detection units 172 formed on the diagnostic wafer 170.

The magnetization detection units 172 can be integrally formed on the diagnostic wafer 170 using a semiconductor process. This allows the magnetization detection units 172 to be arranged with a higher density than that of conventional commercially available magnetization probes. Accordingly, with the N magnetization detection units 172, this arrangement allows the external magnetic field $B_{EX}$ generated by the magnetic field application apparatus 140 to be measured at many points, thereby allowing the intensity distribution thereof to be acquired.

With a method using a conventional commercially available magnetization probe, such a magnetization probe requires a dedicated measurement device. Accordingly, in a case in which the output of the measurement device is to be acquired by the tester main body 110, the user is required to build a complicated test system. In contrast, with the present embodiment, an electrical signal acquired from each magnetization detection unit 172 can be processed using a hardware component built into the test head 120, i.e., using a standard hardware component provided to the test apparatus 100. Furthermore, this allows the tester main body 110 to directly process the data with respect to the magnetization distribution thus acquired.

Furthermore, in the present embodiment, the magnetic field application apparatus 140 is built into the wafer connection HiFix 150. In many test apparatuses, the temperature characteristics of the wafer under test 10 are tested, and the temperature of the stage 130 is dynamically controlled. The electromagnet that forms the magnetic field application apparatus 140 changes the magnetic field intensity according to the amount of current supplied. However, the electromagnet itself acts as a heat source. Accordingly, in a case in which the magnetic field application apparatus 140 is arranged in the vicinity of the temperature-controllable stage 130, such an arrangement has the potential to have an adverse effect on the temperature control operation of the stage 130. With the present embodiment using the test probe card 160 and the wafer under test 10 (or the diagnostic wafer 170 and the diagnostic probe card 180), this allows the magnetic field application apparatus 140 to be separated from the stage 130 that functions as a heat source. Accordingly, such an arrangement is resistant to the effects of heat.

As described in second and third embodiments, the magnetic field application apparatus 140 may be arranged below or to the side of the stage 130. In this case, such an arrangement requires an additional control line that allows the test head 120 to control the magnetic field application apparatus 140. In contrast, with the embodiment 1 in which the magnetic field application apparatus 140 is built into the wafer connection HiFix 150, this allows a control signal to be transmitted to the magnetic field application apparatus 140 using the existing interface circuits 128 and 152 arranged between the test head 120 and the wafer connection HiFix 150. This allows the system to be designed in a simple manner. Furthermore, the magnetic field application apparatus 140 can be handled in the same manner as the hardware components built into the test head 120. This allows control instructions to be supplied to the magnetic field application apparatus 140 to be written in a test program to be executed by the tester main body 110.

Next, description will be made regarding modifications relating to the embodiment 1.

Modification 1

Figure 6:
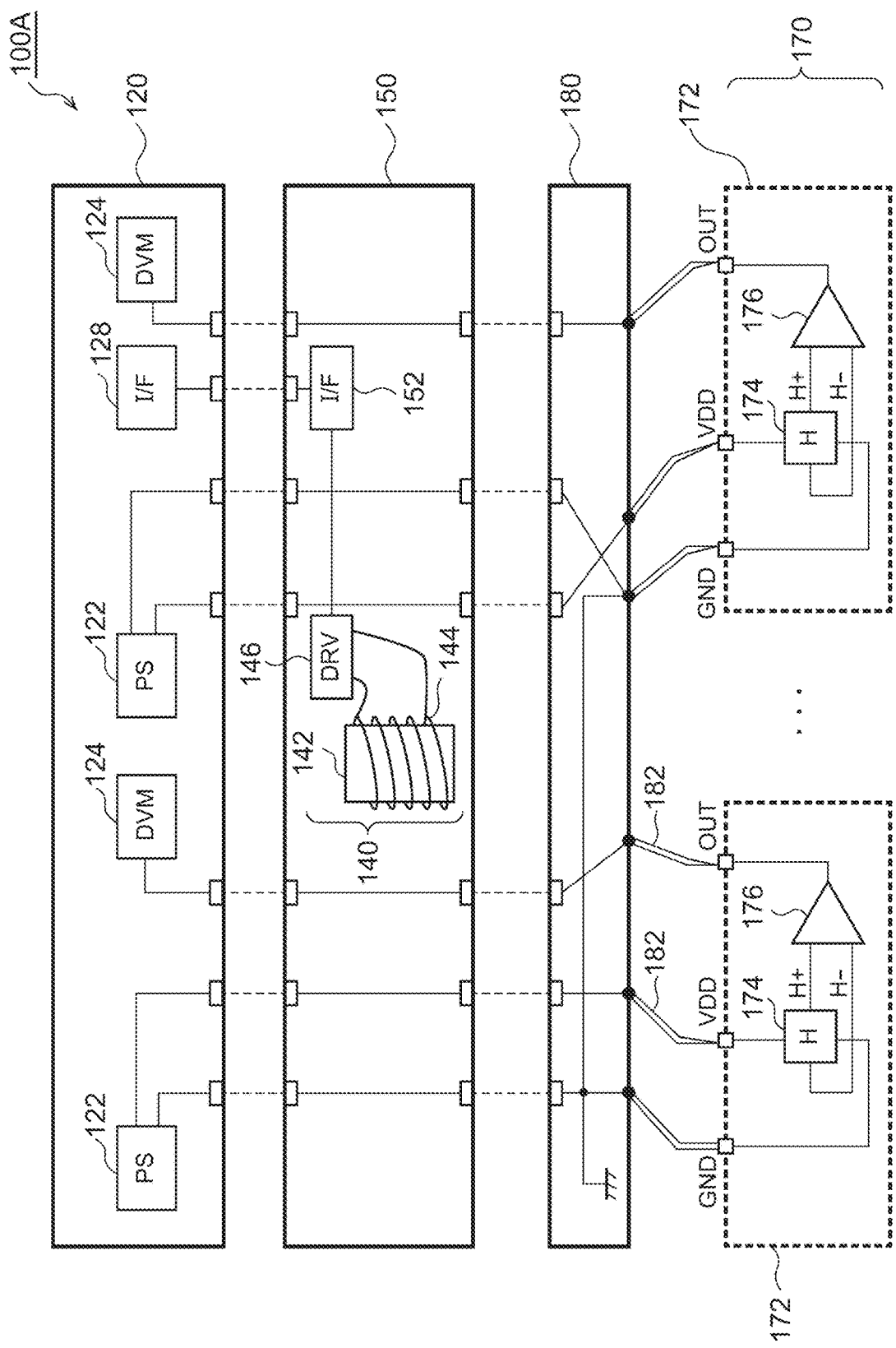
FIG. 6 is a diagram showing a test apparatus according to a modification 1.

FIG. 6 is a diagram showing a test apparatus 100A according to a modification 1. In the diagnostic probe card 180 according to the modification 1, the GND pins of the multiple magnetization detection units 172 are coupled to each other and grounded to a common ground. With the diagnostic probe card 180 in which the GND pins are short-circuited, this allows the impedance to be reduced, thereby providing improved noise resistance.

Modification 2

Figure 7:
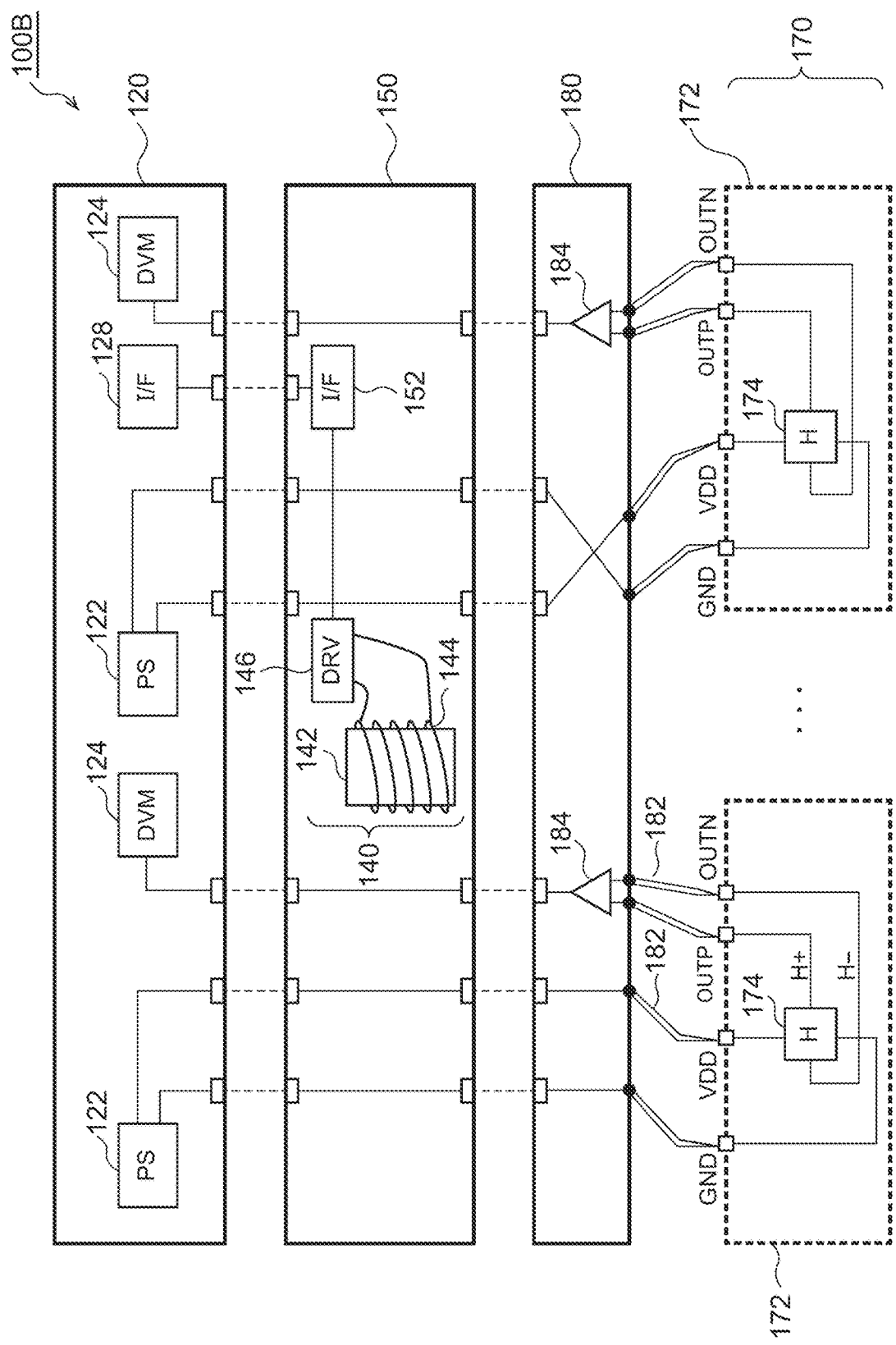
FIG. 7 is a diagram showing a test apparatus according to a modification 2.

FIG. 7 is a diagram showing a test apparatus 100B according to a modification 2. Each magnetization detection unit 172 includes a magnetization sensor 174, a power supply pin VDD, a ground pin GND, and a pair of output pins OUTP and OUTN. A pair of a positive electrical signal H+ and a negative electrical signal H− generated by the magnetization sensor 174 are supplied to the diagnostic probe card 180 via the output pins OUTP and OUTN. The diagnostic probe card 180 is provided with an amplifier 184 that amplifies the difference between the electrical signals H+ and H−. The output of the amplifier 184 is supplied to and acquired by the DVM 124 via the wafer connection HiFix 150.

The modification 1 described above has an advantage of a reduced number of the probe needles 182 as compared with the modification 2. In contrast, with the modification 2, a discrete component can be employed as the amplifier 184. This allows amplifiers with more stable and/or higher performance to be employed as compared with the amplifiers 176 integrated on the diagnostic wafer 170

Modification 3

Figure 8:
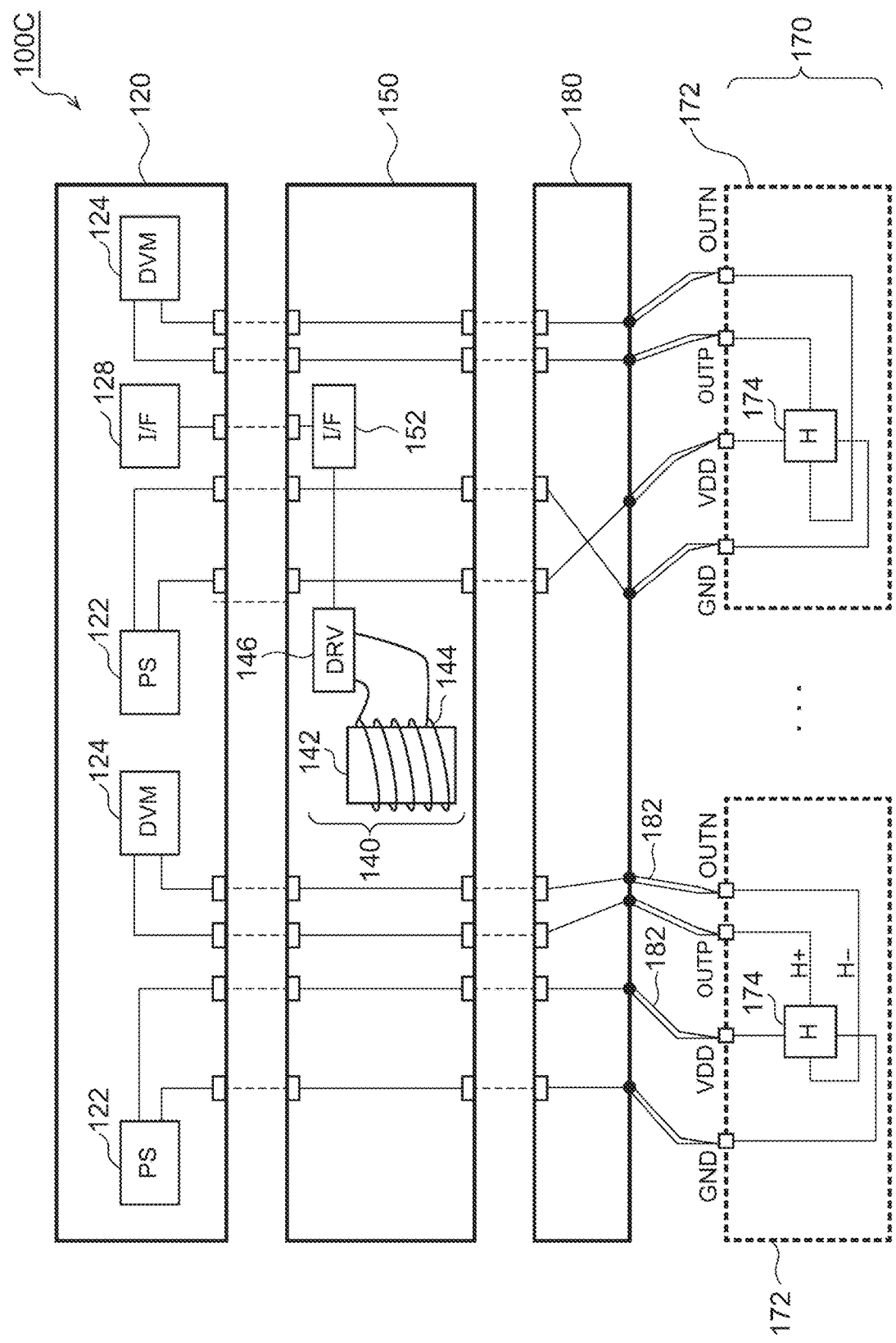
FIG. 8 is a diagram showing a test apparatus according to a modification 3.

FIG. 8 is a Diagram Showing a Test Apparatus 100C According to a Modification 3. Each magnetization detection unit 172 has the same configuration as that in the modification 2. In the modification 3, a pair of a positive electrical signal H+ and a negative electrical signal H− generated by the magnetization sensor 174 are supplied to and acquired by the DVM 124 via the output pins OUTP and OUTN, the diagnostic probe card 180, and the wafer connection HiFix 150. The modification 3 is effectively employed for a platform in which the electrical signals H+ and H− are acquired with a sufficiently large signal level and with a high SN ratio.

Modification 4

Figure 9:
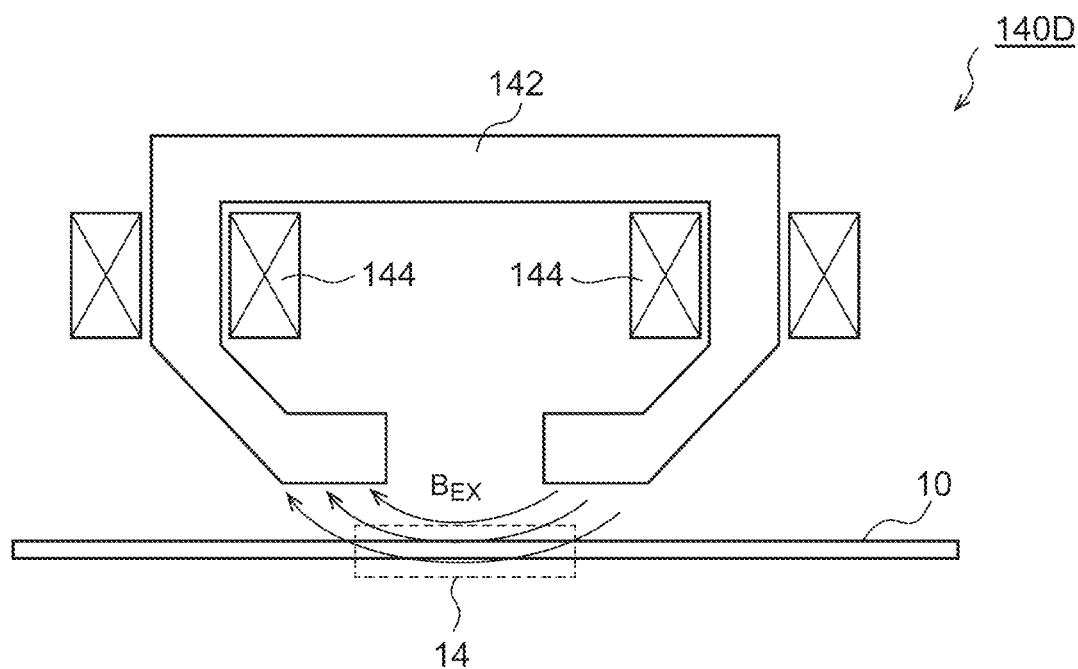
FIG. 9 is a cross-sectional diagram showing a magnetic field application apparatus according to the modification 1.

Description has been made in the embodiment 1 regarding an arrangement in which the external magnetic field $B_{EX}$ is generated in a direction that is orthogonal to the wafer under test 10. However, the present invention is not restricted to such an arrangement. Also, the magnetic field application apparatus 140 may be configured to apply the external magnetic field $B_{EX}$ in an in-plane direction of the wafer under test 10. FIG. 9 is a cross-sectional diagram showing a magnetic field application apparatus 140D according to the modification 1. The magnetic field application apparatus 140 is built into the wafer connection HiFix 150 as described above. In FIG. 9, the test probe card 160 is not shown.

Modification 5

Figure 10C:
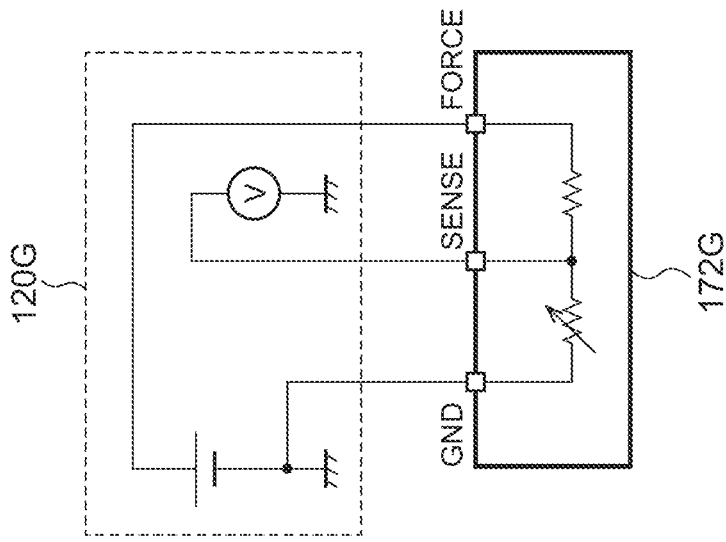
FIG. 10A through FIG. 10C are circuit diagrams each showing a magnetization detection unit and a test head according to a modification 5.
Figure 10B:
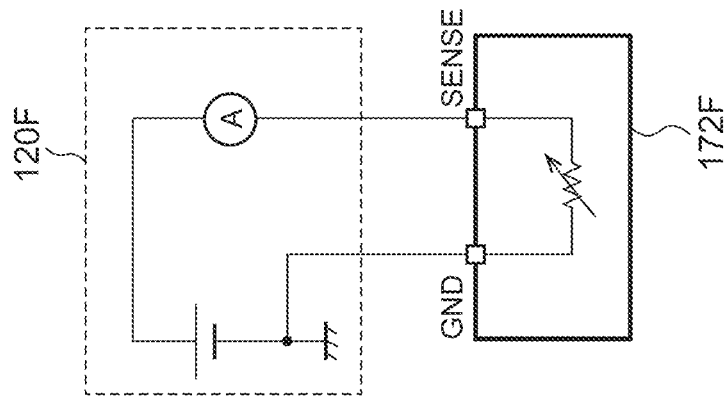
Figure 10A:
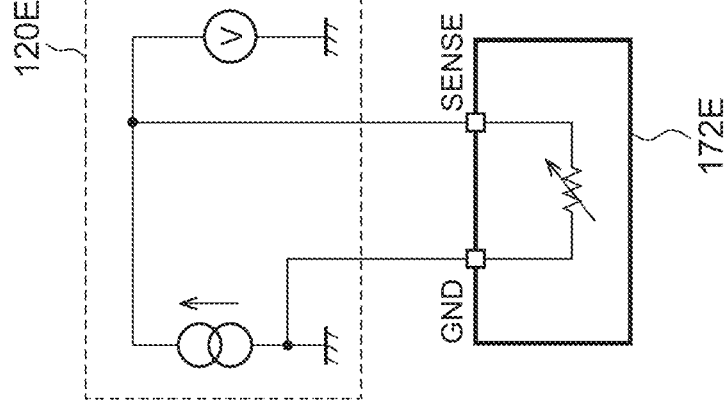

As the magnetic sensor 174, instead of the Hall element, the magnetization detection unit 172 may be provided with a magnetic resistance (MR) sensor having a resistance that changes according to the magnetic field. FIG. 10A through FIG. 10C are circuit diagrams each showing the magnetization detection unit 172 and the test head 120 according to a modification 5. Magnetization detection units 172E and 172F shown in FIG. 10A and FIG. 10B each include a MR element 178. The test head 120E shown in FIG. 10A detects the change in the resistance value of the MR element 178 by current application and voltage measurement. The test head 120F shown in FIG. 10B detects the change in the resistance value of the MR element 178 by voltage application and current measurement. The magnetization detection unit 172G shown in FIG. 10C includes a resistor 179 in addition to the MR element 178. The test head 120G applies a constant voltage between the FORCE pin and the GND pin, and measures the voltage that occurs at the SENSE pin. The resistor 179 may be provided to the diagnostic probe card 180.

Modification 6

Description has been made in the embodiment regarding an arrangement in which the wafer under test 10 is measured in a divided manner. Also, the present disclosure is applicable to a Full Wafer Contact method. In this case, the magnetic field application apparatus 140 is configured to be capable of applying a uniform magnetic field over the entire face of the wafer under test 10.

Embodiment 2

Figure 11:
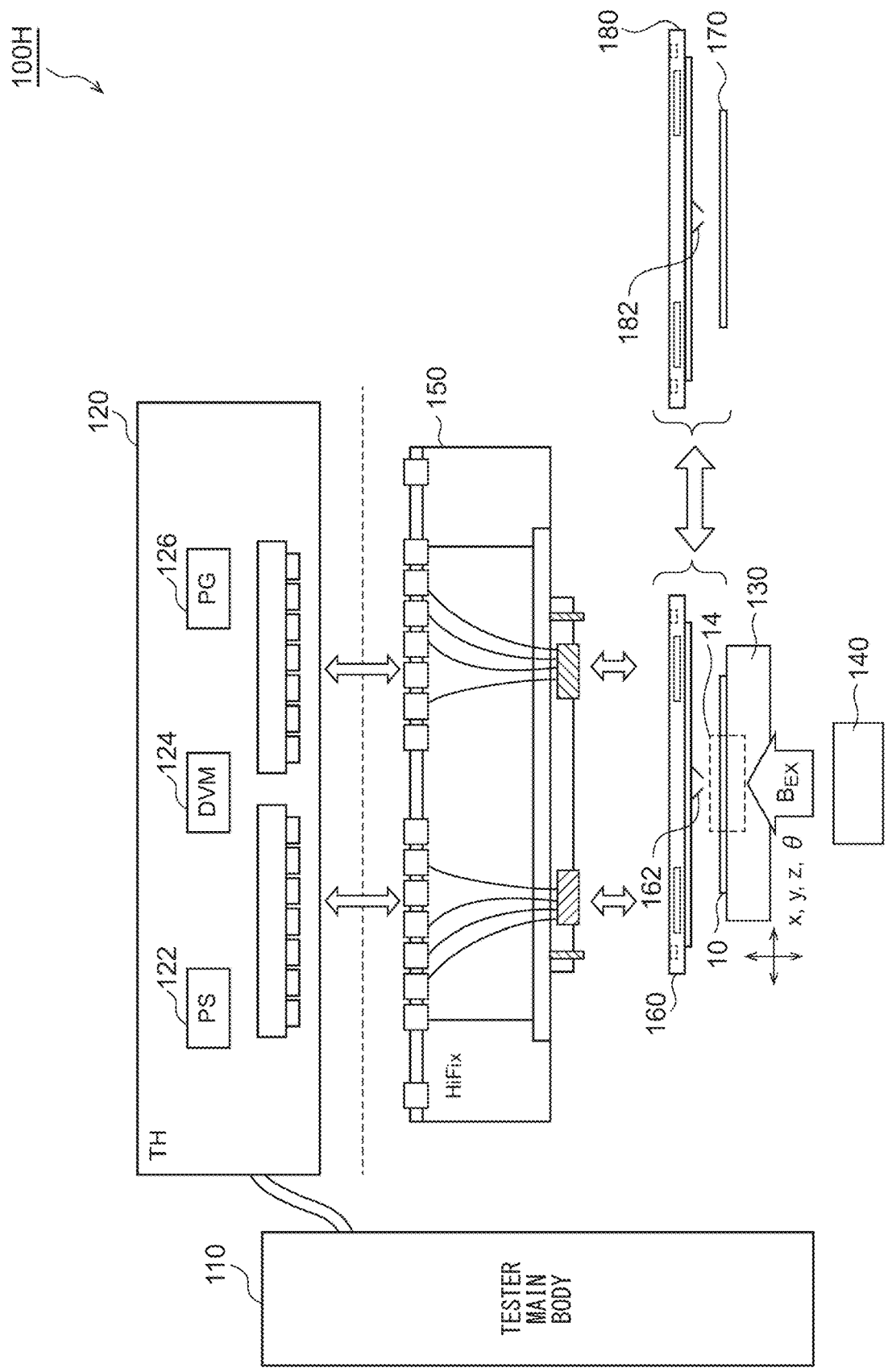
FIG. 11 is a block diagram showing a test apparatus according to an embodiment 2.

Description has been made in the embodiment 1 regarding an arrangement in which the magnetic field application apparatus 140 is built into the wafer connection HiFix 150. However, the present invention is not restricted to such an arrangement. FIG. 11 is a block diagram showing a test apparatus 100H according to an embodiment 2. In the embodiment 2, the magnetic field application apparatus 140 is arranged below the stage 130. As described above, the stage 130 functions as a heat source, and the magnetic field application apparatus 140 is readily affected by heat. Accordingly, thermal insulation may preferably be applied between the magnetic field application apparatus 140 and the stage 130.

The magnetic field application apparatus 140 may generate the external magnetic field $B_{EX}$ in a direction that is orthogonal to the wafer under test 10 or in an in-plane direction.

Embodiment 3

Figure 12:
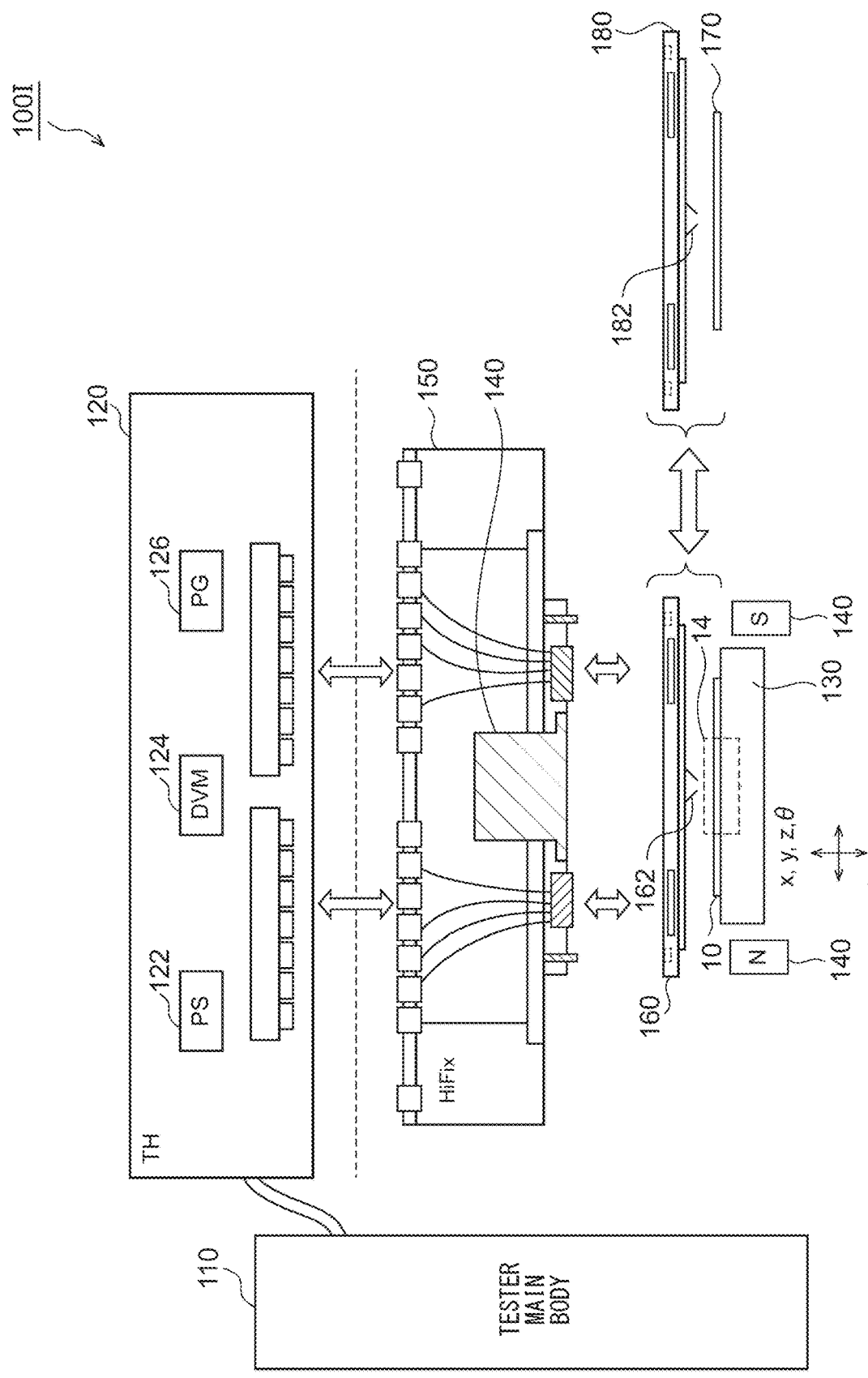
FIG. 12 is a block diagram showing a test apparatus according to an embodiment 3.

FIG. 12 is a block diagram showing a test apparatus 100I according to an embodiment 3. In the embodiment 3, the magnetic field application apparatus 140 is arranged to the side of the stage 130, and generates the external magnetic field $B_{EX}$ in an in-plane direction of the wafer under test 10. With such an arrangement, this allows a uniform magnetic field to be formed over a wide area.

Description has been made in the embodiments 1 through 3 regarding an arrangement in which the device under test 12 is MRAM. However, the present invention is not restricted to such an arrangement. Also, the device under test 12 may be various kinds of magnetic sensors such as Hall sensors, MR sensors, etc. In this case, the external magnetic field $B_{EX}$ generated by the magnetic field application apparatus 140 is changed, and the responsivity of the magnetic sensor with respect to the change in the external magnetic field $B_{EX}$ is measured.

While the preferred embodiments of the present disclosure have been described using specific terms, such description is for illustrative purposes only, and it is to be understood that changes and variations may be made without departing from the spirit or scope of the appended claims.

What is claimed is:

1. A test method for testing, by a test apparatus, a wafer under test on which devices under test each comprising magnetoresistive memory or a magnetic sensor are formed, the method comprising:
   mounting the wafer under test on a stage in a test process;
   applying, by a magnetic field application apparatus, a magnetic field to the wafer under test in the test process;
   making, by a test probe card, probe contact with the wafer under test in the test process;
   removing the wafer under test;
   mounting a diagnostic wafer on the stage in a diagnostic process of the test apparatus after the removing the wafer under test, wherein a plurality of magnetization detection units are formed on the diagnostic wafer, and the diagnostic wafer is structured to measure a magnetic field generated by the magnetic field application apparatus by means of each magnetization detection unit in the diagnostic process;

removing the test probe card; and using a diagnostic probe card in the diagnostic process after the removing the test probe card, and making probe contact with the diagnostic wafer.

2. The test method according to claim 1, wherein the test apparatus further comprises a connection unit arranged between the test probe card or the diagnostic probe card and a test head of the test apparatus, wherein the magnetic field application apparatus is provided to the connection unit.

3. The test method according to claim 1, wherein the plurality of magnetization detection units each comprise:

a magnetic sensor; and an amplifier structured to amplify an electrical signal output from the magnetic sensor.

4. The test method according to claim 2, wherein the plurality of magnetization detection units each comprise:

a magnetic sensor; and an amplifier structured to amplify an electrical signal output from the magnetic sensor.

5. The test method according to claim 1, wherein the plurality of magnetization detection units each comprise a magnetic sensor, wherein the diagnostic probe card comprises a plurality of amplifiers that correspond to the plurality of magnetization detection units, and wherein each amplifier is structured to amplify an electrical signal output from the corresponding magnetic sensor.

6. The test method according to claim 2, wherein the plurality of magnetization detection units each comprise a magnetic sensor, wherein the diagnostic probe card comprises a plurality of amplifiers that correspond to the plurality of magnetization detection units, and wherein each amplifier is structured to amplify an electrical signal output from the corresponding magnetic sensor.

* * * * *